United States Patent [19]

Lindig et al.

[11] Patent Number: 4,633,174
[45] Date of Patent: Dec. 30, 1986

[54] CROSSED-COIL ROTATING-MAGNET MEASURING INSTRUMENT

[75] Inventors: Christian Lindig, Kelkheim; Roland Duffait, Eschborn, both of Fed. Rep. of Germany

[73] Assignee: VDO Adolf Schindling AG, Frankfurt am Main, Fed. Rep. of Germany

[21] Appl. No.: 636,654

[22] Filed: Aug. 1, 1984

[30] Foreign Application Priority Data

Aug. 10, 1983 [DE] Fed. Rep. of Germany ....... 3328860

[51] Int. Cl.⁴ .................... G01R 11/30; G01R 11/36
[52] U.S. Cl. .................... 324/143; 324/146; 336/188; 336/189; 336/207
[58] Field of Search .......... 324/143, 144, 146; 335/222, 282; 336/188, 189, 207, 208

[56] References Cited

U.S. PATENT DOCUMENTS

| 3,168,689 | 2/1965 | Gelenius | 324/146 X |
| 3,302,191 | 1/1967 | Ziegler | 324/146 X |
| 3,327,208 | 6/1967 | Allen | 324/146 X |
| 3,460,038 | 8/1969 | Ziegler | 324/146 |
| 4,492,920 | 1/1985 | Reenstra | 324/146 |

FOREIGN PATENT DOCUMENTS 3232302 3/1984 Fed. Rep. of Germany ...... 324/146

Primary Examiner—Stanley T. Krawczewicz
Attorney, Agent, or Firm—Martin A. Farber

[57] ABSTRACT

In a crossed-coil rotating-magnet measuring instrument having an approximately cylindrical core developed as winding form, a first and second coil are wound crossed one above the other. The second coil is necessarily arranged over the first coil in the regin of the ends of the winding form and thus has a greater height of winding than the latter. Within the core there is also provided a rotating magnet whose pointer shaft is extended out of an extension of the core. In order to reduce the linearity error of this measuring instrument and to permit a reading over several quadrants, spacer means are provided on the core for guiding turns of the coil spaced from the extension of the core around the latter in a rectangular plane in each case. In combination with this, the core is developed with a large diameter in the winding region of the first coil, said diameter being of such a value with respect to the diameter of the winding region of the second coil that the average lengths of the turns of the two coils are the same.

2 Claims, 3 Drawing Figures

4,633,174

CROSSED-COIL ROTATING-MAGNET MEASURING INSTRUMENT

FIELD AND BACKGROUND OF THE INVENTION

The invention relates to a crossed-coil rotating-magnet measuring instrument.

Crossed-coil rotating-magnet measuring instruments have an approximately cylindrical core, developed as a winding form, on which a first and a second coil are wound crossed one over the other, the second coil being arranged in the region of the ends of the winding form over the first coil and thus having a greater height of winding than the latter, there being mounted in the core a rotating magnet whose pointer shaft is extended out of an extension on the core.

Such known cross-coil rotating-magnet measuring instruments are used for various measuring and indicating purposes, for instance for the measurement of the level of filling of containers or temperature or else as voltmeter or ammeter.

The known crossed-coil rotating-magnet measuring instruments have a core used as winding form and within which the rotating magnet is turnably mounted. From one end of the substantially cylindrical core there protrudes an extension within which the rotating-magnet shaft is arranged and passes into the pointer shaft which is extended out of the extension. Upon the winding of the core, the turns of the coils are deformed in the region of the extension of the core and thus do not lie in a flat rectangular winding plane. Since furthermore the two coils which cross each other on the core must necessarily be wound one above the other in the region of the ends of the core, the heights of winding of the two coils are different.

It has been found that with known crossed-coil rotating-magnet measuring instruments of the aforementioned type there can only be obtained angles of deflection which are slightly above 90°. If only the first quadrant essentially is utilized in these measuring instruments, calibration to the desired final value of the full deflection can be effected by adjustment of at least one voltage signal which acts on one of the two coils. However, it is not readily possible to use such crossed-coil rotating-magnet measuring instruments for reading over several quadrants since a displacement of the final value in the first quadrant necessarily results in a displacement in opposite direction in the third quadrant.

It is an object of the invention so to improve a crossed-coil rotating-magnet measuring instrument of the aforementioned type that it can be used with sufficient accuracy for reading over several quadrants and in particular up to the third quadrant. Difficulties resulting from a calibration by means of adjustment of a voltage signal in a coil are to be avoided in this connection.

SUMMARY OF THE INVENTION

According to the invention, spacer means (bars 11–14) are arranged on the core (1) and guide turns of the coils (9, 10) spaced from the extension of the core around the latter, in each case a rectangular plane, and that the core has, in the winding region (7) of the first coil (9), a diameter which is so increased as compared with the diameter of winding region (8) of the second coil (10) that the average lengths of turns of the first and the second coil are equal.

By the combination of these features an error of linearity of the pointer deflection over several quadrants is substantially reduced so that voltage control of both coils with two voltage signals whose maximum values are equal is possible. In this way it is avoided that the error in the third quadrant is increased by a calibration in the first quadrant or vice versa.

The spacer means provided as combination feature are preferably developed as elongated bars (11-14) which are embedded in the cylindrical wall region of the core and are at least as wide as the extension point (2) of the core where the pointer shaft is brought out.

By the elongated bars, which preferably extend into the ends of the core and are rounded at the ends as well as on their tops, there is assured a particularly reliable guiding of the winding wire which does not interfere with the winding process.

BRIEF DESCRIPTION OF THE DRAWING

With the above and other objects and advantages in view, the present invention will become more clearly understood in connection with the detailed description of a preferred embodiment, when considered with the accompanying drawing, of which.

DETAILED DESCRIPTION OF THE PREFERRED EMBODIMENT

Figure 1:
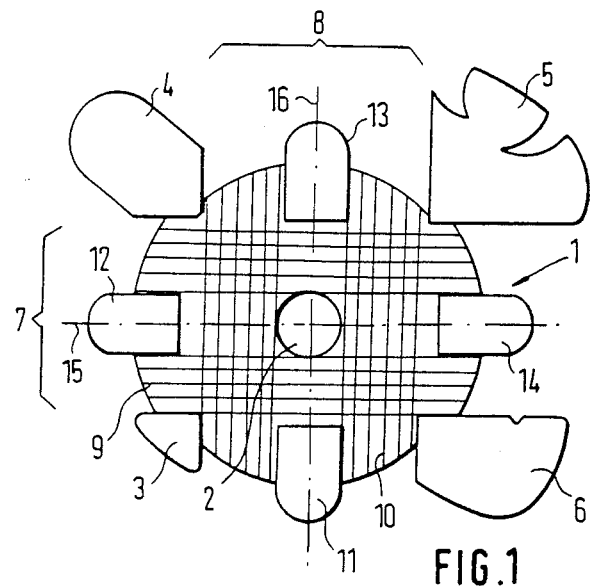
FIG. 1 is the core in a top view of the side from which the extension extends.
Figure 2:
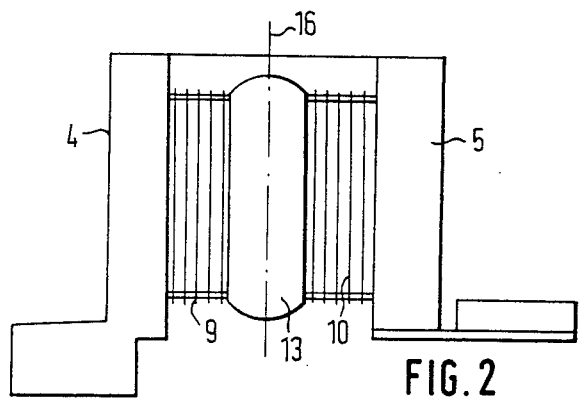
FIG. 2 is a side view of the core.
Figure 3:
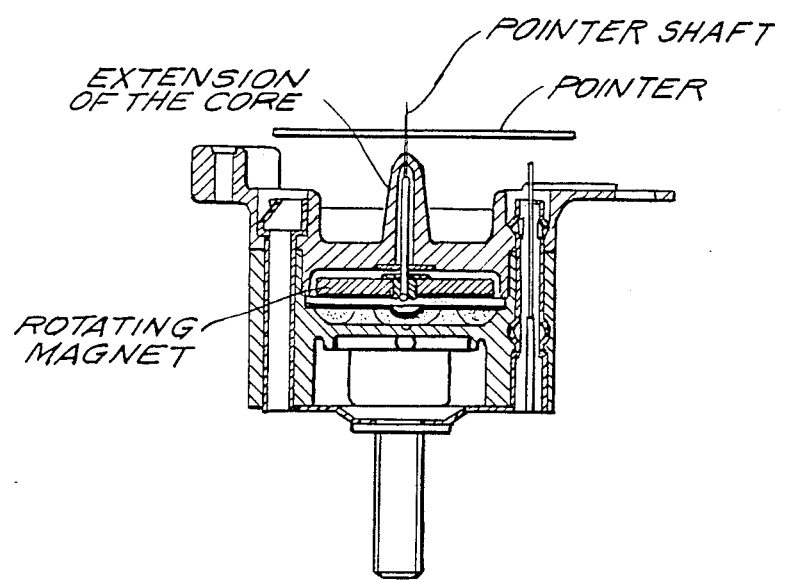
FIG. 3 shows a pointer shaft extending from an extension of the core of FIG. 1.

From FIGS. 1, 2 and 3 there can be noted the substantially cylindrical shape of the core, designated generally as 1, used as winding form. An extension for a pointer shaft extends out of the point 2 from one end of the core. By guide elements 3 to 7 on the periphery of the cylindrical form of the core the latter is subdivided into two winding regions 7 and 8. The winding region is intended for the winding of the core with a first coil 9 over which a second coil 10 is wound, crossed 90°, in the second winding region.

As indicated in FIG. 1, the diameter of the core in the winding region 7 is greater than in winding region 8, in such a manner that the greater height of winding of the second coil 10 as compared with the first coil 9 is compensated for, i.e. the average length of turn for both coils 9 and 10 is the same. From this there furthermore result for identical signal voltages in the two coils an identical number of turns and, in the case of the same diameter of wire, the same resistance of the two coils.

In connection with the above measures there should also be noted the structural measure which consists therein that by four elongated bars 11 to 14 it is seen to it that the windings of the coils are not pressed away out of the region of the extension at the point 2 but are guided in flat rectangular planes. The flat rectangular planes figuratively cut the core in longitudinal planes outside of the central longitudinal axis of the core. The elongated bars divide each of the two winding regions 7 and 8 into two individual winding regions of equal size. Therefore conditions symmetrical to two planes are present for the winding of the core, namely with respect to the central planes which extend, on the one hand, through the bars 13 and 11 and, on the other hand, through the bars 12 and 14. These central planes are designated 15 and 16.

The rounding of the bars 11 to 14 at the ends and on their outer surfaces can be noted in detail from the drawing. This shape can facilitate the winding process and in addition assist in avoiding damage to the wire.

It has surprisingly been found that in the case of a crossed-coil rotating-magnet measuring instrument of the type described the linearity can be improved by, for example, 500%.

We claim:

1. A crossed-coil rotating-magnet measuring instrument comprising an approximately cylindrical core configured as a winding form, on which a first coil and a second coil are wound crossed one over the other, the second coil being disposed in the region of ends of the winding form over the first coil and thereby having a greater height of winding than the latter, and there being mounted in the core a rotating magnet having a pointer shaft extending out of an extension on the core, the instrument including an improvement comprising spacer means disposed on the core for guiding turns of the coils in a planar configuration alongside the extension of the core, each turn of the coil lying in a rectangular plane, and wherein said core is asymmetrical, asymmetry of the core being characterized by an enlarged diameter in a winding region of the first coil, the diameter of the core being enlarged as compared with the diameter of a winding region of the second coil so as to equalize the average lengths of turns of the first coil and the second coil, thereby improving linearity in measurements employing rotations of said magnet over a plurality of quadrants.

2. The cross-coil rotating-magnet measuring instrument according to claim 1, wherein said spacer means are elongated bars extending along a diametrical plane of the core from a cylindrical wall region of the core, and are at least as wide as said extension.

* * * * *